(12) United States Patent
Buchberger et al.

(10) Patent No.: US 7,972,486 B2
(45) Date of Patent: Jul. 5, 2011

(54) MACHINE FOR COATING A SUBSTRATE, AND MODULE

(75) Inventors: Hans Buchberger, Kronberg (DE); Andreas Geiss, Hanau (DE); Jörg Krempel-Hesse, Eckartsborn (DE); Dieter Haas, Bruchköbel (DE)

(73) Assignee: Applied Materials GmbH & Co. KG (DE)

( * ) Notice: Subject to any disclaimer, the term of this patent is extended or adjusted under 35 U.S.C. 154(b) by 1006 days.

(21) Appl. No.: 11/279,047

(22) Filed: Apr. 7, 2006

(65) Prior Publication Data

US 2006/0226004 A1 Oct. 12, 2006

(30) Foreign Application Priority Data

Apr. 8, 2005 (EP) ..................................... 05007805

(51) Int. Cl.
*C23C 14/34* (2006.01)
(52) U.S. Cl. ......... 204/298.12; 204/298.21; 204/298.19; 156/345.1
(58) Field of Classification Search ............. 204/298.12, 204/298.21, 298.19; 156/345.1
See application file for complete search history.

(56) References Cited

U.S. PATENT DOCUMENTS

| | | |
|---|---|---|
| 4,026,787 A | 5/1977 | Kuehnle |
| 4,278,528 A * | 7/1981 | Kuehnle et al. .......... 204/298.11 |
| 4,693,803 A * | 9/1987 | Casey et al. .............. 204/298.24 |
| 5,487,822 A * | 1/1996 | Demaray et al. ......... 204/298.09 |
| 5,490,910 A * | 2/1996 | Nelson et al. ............ 204/192.15 |

FOREIGN PATENT DOCUMENTS

| | | |
|---|---|---|
| CN | 1407129 A | 8/2002 |
| CN | 1576388 A | 7/2004 |
| DE | 102 37 311 A | 8/2001 |
| JP | 2001003168 A | 1/2001 |
| JP | 2001253536 A | 9/2001 |
| JP | 2003229468 A | 8/2003 |

* cited by examiner

*Primary Examiner* — Nam X Nguyen
*Assistant Examiner* — Jason M Berman
(74) *Attorney, Agent, or Firm* — Christopher J. Kulish

(57) ABSTRACT

A machine for coating a transparent substrate for the production of display screens comprises a coating chamber that has a modular design. Each of the modules 1 features a chamber section 2, a first support 3 that is arranged removably in or at the chamber section 2, and a second support 4 that is arranged removably at the first support 3. Whereas the first support 3 bears the cathodes, the second support 4 is formed as a cover at which are arranged the pumps for producing a vacuum in the coating chamber. Carriers 3 and 4 can be removed laterally from the chamber section 2 to such an extent that areas 11*a*, 11*b* accessible to persons can be formed between the module components. In this way, the components of the machine are readily accessible, for example for maintenance purposes. Work can be done simultaneously on the cathodes and in the chamber interior.

32 Claims, 3 Drawing Sheets

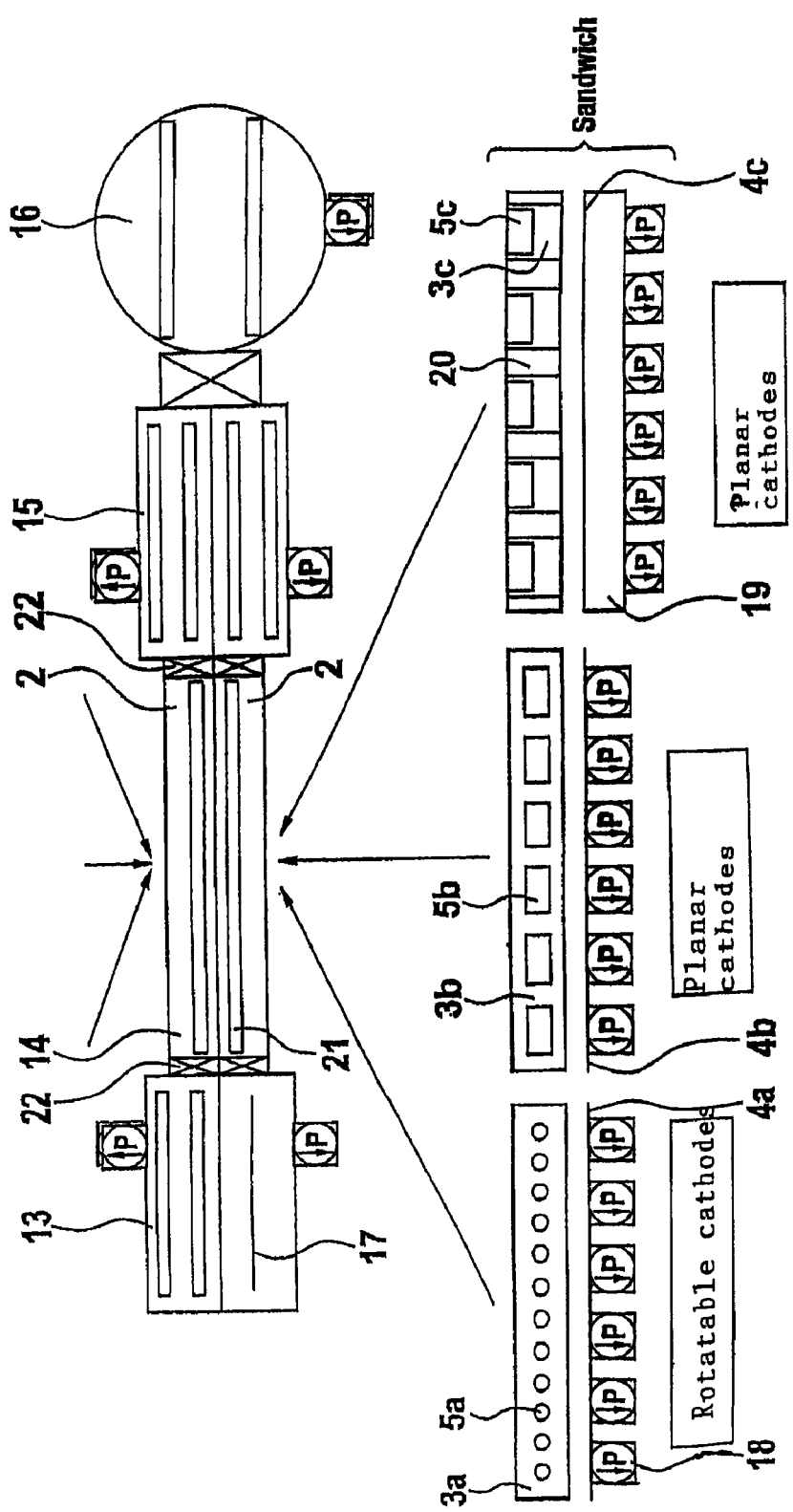

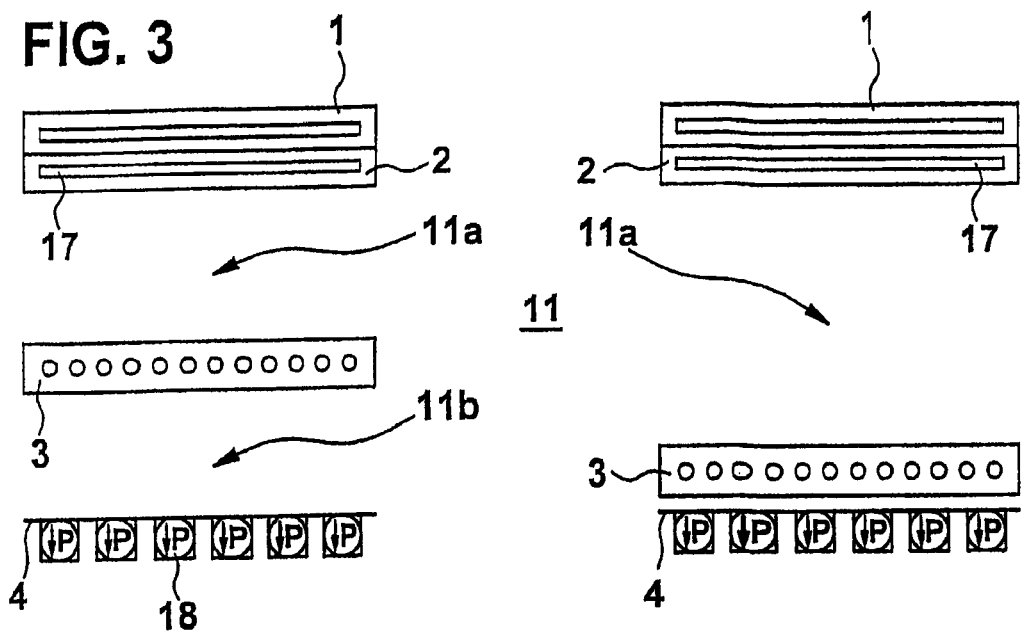
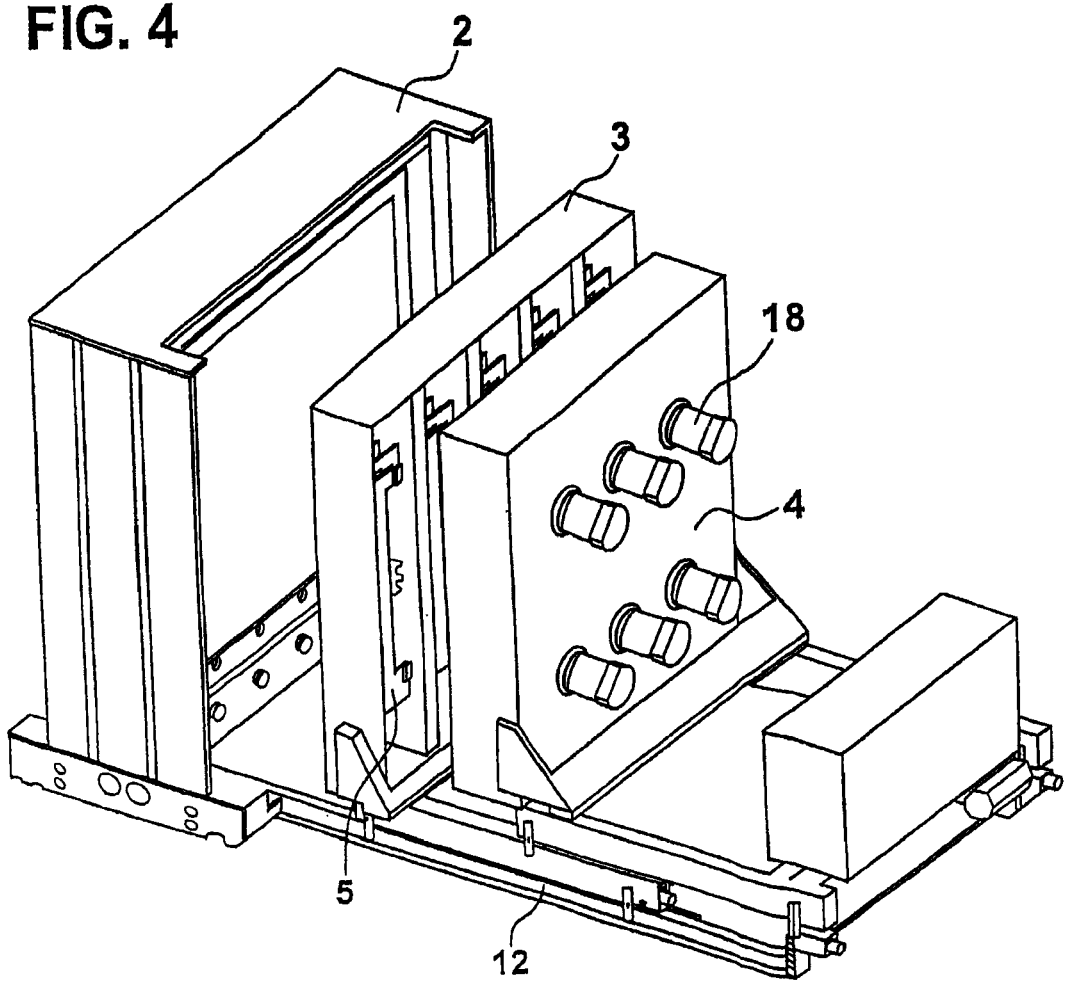

MACHINE FOR COATING A SUBSTRATE, AND MODULE

DETAILED DESCRIPTION

The invention concerns a machine for coating a substrate, comprising a coating chamber and a module for a machine for coating a substrate.

In conventional coating machines for the production of flat screens, color filters, displays and the like, the substrates are accommodated by means of conventional clamping devices on an aluminum plate and guided through a coating machine having several chambers.

For maintenance and cleaning purposes, a wall section of the chamber is removed or disassembled. Subsequently, the interior of the chamber can be cleaned and a target change can be performed. Meanwhile, the machine is at a standstill. The downtimes are relatively long since access to the interior of the chamber is restricted and, moreover, awkward.

Between the individual coating chambers are arranged pump compartments through which the chambers are evacuated. On account of this design, conventional machines extend for a relatively large length.

Starting therefrom, one object of the present invention is to provide a machine and a module for a coating machine that facilitates maintenance work on wear parts and reduces downtimes of the machine.

This object is achieved with a coating machine in accordance with claim 1 and a module for a coating machine in accordance with claim 18.

A machine of the invention for coating a substrate comprises a coating chamber of modular design, wherein one module features a chamber section, a removable first support in or at the chamber section, and a removable second support that is arranged at the first support. The machine is used, for example, for coating a transparent substrate, especially for the production of display screens.

Any number of modules may be arranged in series in a coating machine as required. The same or different processes may be performed in the modules. The modular structure allows for flexible arrangement or assembly of the machines. However, the scope of the invention also provides for the use of just a single module as part of a coating chamber or as a coating chamber.

The supports can be retracted or traversed away from the vented chamber section. Additionally, they can be separated from each other. The first support is essentially arranged between the chamber section and the second support. In this way, a sandwich-type structure is formed.

For maintenance purposes, first the outer support is removed from the first support and from the coating chamber. Alternatively to this, both supports can be traversed away jointly from the chamber section. Subsequently, the first support is moved away from the chamber section or the supports are separated and one of the supports is moved away from the other. In this way, maintenance areas accessible for personnel are created between the chamber section and the first support and/or between the first and the second support.

Since the supports can be separated from the chamber section, areas accessible to persons can be created between the components of the module. Access to the component parts of the individual components of the module (chamber section, first support, second support) is facilitated as a result. Especially, access can be gained at the same time to the coating chamber and the cathodes, e.g. for maintenance. Thus, for example, two teams can clean and maintain the machine at the same time, with one team gaining access to the free space between the first support and the chamber section, and the second team gaining access between the second support and the first support. The first team cleans the coating chamber, especially the shutters and the like contained therein, while the second team maintains the cathodes. In this way, downtimes due to maintenance and cleaning work can be substantially reduced.

The first support is preferably arranged such that it can be laterally removed from the chamber section and the second support such that it can be laterally removed from the first support. The term laterally refers to the transport direction of the substrates and correspondingly to the longitudinal axis of the entire machine:

The second support is especially formed for closing a lateral opening in the chamber section.

At least one process tool especially is arranged at the first support.

Among the possible process tools there are, for example, cathodes for a sputtering process, but generally also tools for other processes, such as evaporation. In addition to the process tools, cooling systems for the cathodes and shutters, media connections, the cathode environment (shutter shields), partition walls for separating individual cathodes, the drive of rotary cathodes, etc, may be arranged at the first support. Electricity, cooling water and process gas can be supplied via corresponding connections on the support. A core idea of the invention is the most logical assignment possible of the components to the module components, such that the components are readily accessible, simple to maintain and can be supplied straightforwardly with energy or process gas.

The process tool preferably features at least one sputtering cathode.

The process tool especially features at least one planar cathode and/or at least one rotary cathode.

Several process tools can be arranged beside each other at the first support.

The process tools can be arranged in a common process space in the coating chamber. One advantage of this embodiment consists in the compact design. It is possible to arrange a large number of cathodes (e.g. ITO) in the first support.

However, the first support may also be formed such that at least two process tools or at least two groups of process tools in the coating chamber are separated from each other by an intermediate element arranged at the first support. In the case of cathodes separated from each other, each cathode may be assigned to a dedicated pump or a group of pumps, which is arranged on the cover behind the cathode. The assignment of a dedicated pump or group of pumps to each cathode is particularly favorable as it enables the gas flows at each cathode to be adjusted individually. Whereas generally the same cathodes, such as ITO cathodes, are used in a common process chamber, the present embodiment permits the use of different cathodes, since a special atmosphere can be generated in the environment of the separated cathodes.

The machine preferably features a pump device for generating a vacuum in the coating chamber with pumps, with at least one of the pumps arranged at the second support. Assignment of the coating components to the three parts of the module is performed under different aspects, such as supply or access for maintenance work. Through the arrangement of the pumps at the second support (i.e. at the cover), the length of the entire machine can be reduced, because no pump compartments are required that are connected in series with the coating chambers. The pumps are now arranged behind the cathodes.

The first support and/or the second support are especially formed as cars or carriages that can be laterally retracted from the chamber section or as cars or carriages that can be laterally traversed away from the chamber section.

Means for guiding the first and/or second support as it is retracted from the chamber section or traversed away from the chamber section and/or inserted into the chamber section or traversed up to the chamber section are a preferred feature.

The means for guiding the supports are preferably formed such that the first support retracted from the chamber section can be removed so far from the chamber section that an area accessible to persons is created between the first support and the chamber section.

The means for guiding the supports may be formed such that the second support traversed away from the first support can be removed so far from the first support that an area accessible to persons is created between the first support and the second support.

The chamber section may feature an essentially vertical passage for transporting the substrate to be coated through the chamber section. However, the invention is not in principle restricted to a vertical arrangement of the substrates transported through it, since the principle of the invention is also applicable to horizontal arrangements.

The process tools are arranged essentially vertically, especially at the first support. For the aforementioned reasons, however, a different arrangement of the cathodes that suits the requirements is conceivable.

The machine especially features at least two modules which are arranged symmetrically with respect to the longitudinal axis. This embodiment is advantageous for machines with a turning station for reducing the length of the entire machine.

A module of the invention for coating a substrate comprises at least a coating chamber, a removable first support that is arranged in or at the chamber section, and a removable second support that is arranged at the first support.

Especially, the module has features such as those already described above.

Further objects and advantages of the invention result from the following description of specific embodiments.

In these,

FIG. 2 is a schematic view of a coating machine from above;

FIG. 3 is a view of two modules from above; and

FIG. 4 is a three-dimensional view of a module of the invention.

Figure 1:
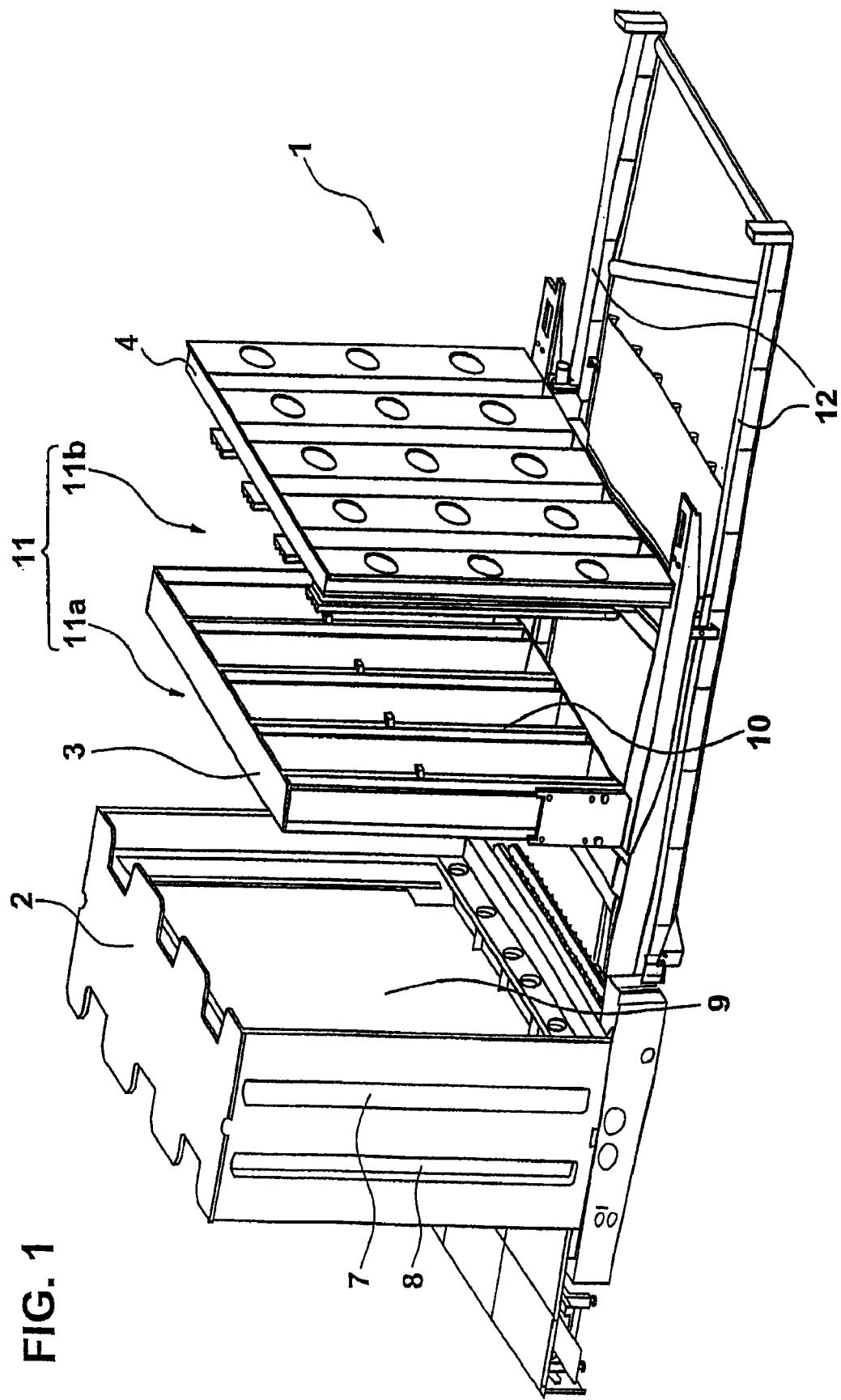
FIG. 1 is a three-dimensional view of a module for a coating machine in accordance with the invention.

FIG. 1 is a three-dimensional view of a module 1 for a coating machine in accordance with the invention. Module 1 consists of a chamber or a chamber section 2, an intermediate support 3 in which the cathodes are arranged, and a cover 4.

Chamber section 2 has on both sides an opening 7 for vertical transport of the substrates through chamber section 2.

The coating chamber in this example has a symmetrical design since the module is intended for use in a coating machine with turning station. Accordingly, chamber section 2 features openings 8 symmetrical with openings 7. The arrows indicate the direction in which the substrates are transported. A partition wall 9 separates the essentially symmetrically shaped chamber segments of chamber section 2.

Chamber section 2 generally accommodates the drives for the substrate and the sensors. Furthermore, shielding and/or heating is provided in front of the rear wall of the chamber or partition wall 9.

Intermediate support 3 is formed in the present example as a carriage that can move relative to chamber section 2. Support 3 is traversable at least between one operating position in which it is traversed into the chamber section 2 or up to chamber section 2, and a maintenance position, as shown in FIG. 1. Through the lateral traversing away of support 3 from chamber 2, a maintenance passage 11a is freed up that is accessible to personnel, such that maintenance work can be performed comfortably and simply in chamber section 2 and on the components that are arranged in support 3 (e.g. target change). Access is possible from maintenance area 11a both to the interior of the chamber section 2 and to support 3.

The intermediate support 3 essentially bears the cathodes (not shown in FIG. 1). In the present example, the cathodes are separated from each other by partition walls 10 in support 3. Apart from the cathodes, the shutters, the cooling system for the cathodes and the shutters, and media connections are provided at the support. The media connections can, for example, be arranged at the bottom of support 3. The cathode environment (shutter shields) may comprise further partition walls 10 for separating individual cathodes from each other as well as a drive for the case that rotary cathodes are used. The electricity supply connections can, for example, be arranged at the top of support 3, such that disconnection of the supply lines is not needed for the performance of maintenance work.

The cover 4 is also formed as a carriage and can move relative to and independently of the first support 3. This means that the support 3 and the cover 4 can be moved away from each other, whereby an additional maintenance passage 11b is freed up. In the maintenance position, an area 11b accessible to personnel is created from which the components arranged at the support 3 and components at the cover 4 are accessible.

The cover 4 essentially bears the turbo molecular pumps (not shown in FIG. 1) of the vacuum system and is separable from the intermediate support 3. The support 3 and the cover 4 can essentially be guided independently of each other on rails 12.

In the operating position, both the support 3 and the cover 4 are traversed up to chamber section 2. Cover 4 closes the opening in the side wall of chamber section 2 or openings in the support 3. The figure shows the sandwich-like structure of the module 1.

FIG. 2 is a schematic diagram of the design of an arbitrary coating machine from above. The machine features a chamber 13 upstream of coating chamber 14, the coating chamber 14, a downstream chamber 15 and a turning station 16. The substrates 17 are transported through the areas 13, 14 and 15 to the turning station 16, rotated through 180° in the turning station and transported back through the coating machine in the opposite direction. The entire machine is essentially designed to be mirror-symmetrical with the longitudinal axis of the machine. Both a continuous and a stationary coating process are conceivable, and so too is vertical or horizontal transport of the substrates.

Heaters 21 are arranged inside areas 13, 14 and/or 15. The coating area 14 features separating valves 22 at the transition areas to areas 13 and 15. By means of the separating valves, individual chamber areas can be vented, e.g. for maintenance work, while venting of the remaining areas is not needed.

The coating area 14, which features a chamber section 2 in the example, can optionally be loaded with different cathode arrangements. These are shown in the lower section of FIG. 2.

The intermediate support 3a shown on the left bears rotary cathodes 5a, and the intermediate support 3b shown in the middle bears modular planar cathodes 5b. The support 3c shown on the right bears planar cathodes 5c separated from each other, with each cathode being assigned to a dedicated pump 18. The cover 4c features a channel 19 and the support 3c features channels 20 by means of which evacuation of the coating chamber is performed. By means of the channels 20, each cathode can receive the pump dedicated to it. Partition walls 10 are provided between the cathodes. By virtue of the assignment of a dedicated pump 18 to each cathode 5c, individual adjustment of the gas flow for each cathode 5c is facilitated.

Cathodes 5a, 5b, 5c are each combined in a support 3a, 3b, 3c. They can be provided for the same or different processes. For different processes, different modules 1 may also be arranged one behind the other and integrated into an overall machine.

Covers 4a, 4b and 4c bear essentially only the pumps 18 and serve to seal the coating chambers.

In FIG. 3, two modules 1 are shown in which the intermediate support 3 and the cover 4 are brought into two different maintenance positions away from chamber section 2.

The intermediate supports 3 and the cover 4 are traversable at a right angle to the transport direction of the substrates 17. For operation of the machine, both the supports 3 and the covers 4 are traversed up to chamber section 2.

In the module 1 shown on the left, two maintenance passages 11a and 11b are formed in the present example between the chamber section 2 and the support 3, and between the support 3 and the cover 4. In this way, it is possible to work simultaneously on the cathodes accommodated in support 3 from maintenance area 11b and on components in the chamber interior from maintenance area 11a.

In the position of the support 3 and the cover 4 shown on the right, a large maintenance area 11a is formed.

FIG. 4 clearly shows the sandwich-like construction of the module 1 with the chamber section 2, the intermediate support 3, which bears the cathodes 5, and the cover 4, at which the turbo molecular pumps 18 are arranged.

From the figure, the formation of the traversable module components 3 and 4 as carriages that can each be moved on rails 12 is clear.

What is claimed is:

1. Machine for coating a substrate, comprising:
   a coating chamber,
   wherein the coating chamber is modular, with one module having:
   a chamber section that defines a space for receiving a substrate and within which such a substrate can be coated, the chamber section defining a pair of vertical slots for receiving a substrate that is to be coated in the chamber section, the vertical slots also defining a plane;
   a first support that is located adjacent to the chamber section,
   at least one process tool attached to the first support;
   a second support that is located adjacent to the first support such that the first support is disposed between the chamber section and the second support,
   at least one pump attached to the second support; and
   a common carriage system for supporting both the first and second supports, defining a linear path that is perpendicular to the plane defined by the slots and that each of the first and second supports is constrained to follow when moved, allowing each of the first and second supports to be moved relative to the chamber section along the path, allowing movement of the first and second supports relative to one another along the path, maintaining the relative position of the first and second supports such that the first support is located between the chamber section and the second support.

2. Machine in accordance with claim 1, wherein:
the first support can be laterally displaced from the chamber section and the second support can be laterally displaced from the first support.

3. Machine of any of the previous claims, wherein:
the second support is formed for closing a lateral opening in the chamber section.

4. Machine in accordance with claim 1, wherein:
the process tool features at least one sputtering cathode.

5. Machine in accordance with claim 4, wherein:
the process tool features at least one planar cathode and/or at least one rotary cathode.

6. Machine in accordance with claim 1, wherein:
several process tools are arranged beside each other at the first support.

7. Machine in accordance with claim 6, wherein:
the process tools are arranged in a common process space in the coating chamber.

8. Machine in accordance with claim 6, wherein:
the first support is formed such that at least two process tools or at least two groups of process tools in the coating chamber are separated from each other by an intermediate element arranged at the first support.

9. Machine in accordance with claim 1, wherein:
the first support and/or the second support are formed as cars or carriages that can be laterally retracted from the chamber section or as cars or carriages that can be laterally traversed away from the chamber section.

10. Machine in accordance with claim 1, wherein:
means are provided for guiding the first and/or second support as it is retracted from the chamber section or traversed away from the chamber section and/or inserted into the chamber section or traversed up to the chamber section.

11. Machine in accordance with claim 1, wherein:
means are provided for guiding the supports and are formed such that the first support retracted from the chamber section can be displaced so far from the chamber section that an area accessible to persons is created between the first support and the chamber section.

12. Machine in accordance with claim 1, wherein:
means are provided for guiding the supports and are formed such that the second support traversed away from the first support can be displaced so far from the first support that an area accessible to persons is created between the first support and the second support.

13. Machine in accordance with claim 1, wherein:
the chamber section features an essentially vertical passage for transporting the substrate to be coated through the chamber section.

14. Machine in accordance with claim 6, wherein:
there is an essentially vertical arrangement of the process tools at the first support.

15. Machine in accordance with claim 1, wherein:
the machine features two modules which are arranged symmetrically with respect to the longitudinal axis.

16. Module for a machine for coating a substrate, comprising:
at least a chamber section that defines a space for receiving a substrate and within which such a substrate can be coated, the chamber section defining a pair of slots for receiving a substrate that is to be coated in the chamber section, the slots also defining a plane;
a first support that is located adjacent to the chamber section;

a second support that is located adjacent to the first support such that the first support is disposed between the chamber second and the second support; and a carriage system for supporting both the first and second supports, defining a linear path that is perpendicular to the plane defined by the slots and that each of the first and second supports is constrained to follow when moved, allowing each of the first and second supports to be moved relative to the chamber section along the path, allowing movement of the first and second supports relative to one another along the path, maintaining the relative position of the first and second supports such that the first support is located between the chamber section and the second support.

17. Module in accordance with claim 16, wherein:
the first support can be laterally displaced from the chamber section and the second support can be laterally displaced from the first support.

18. Module in accordance with any of previous claim 16 or 17, wherein:
the second support is formed for closing a lateral opening in the chamber section.

19. Module in accordance with claim 16, wherein:
at least one process tool is arranged at the first support.

20. Module in accordance with claim 19, wherein:
the process tool features at least one sputtering cathode.

21. Module in accordance with claim 19 or 20, wherein:
the process tool features at least one planar cathode and/or at least one rotary cathode.

22. Module in accordance with claim 16, wherein:
several process tools are arranged beside each other at the first support.

23. Module in accordance with claim 22, wherein:
the first support is formed such that at least two process tools or at least two groups of process tools are separated from each other by an intermediate element arranged at the first support.

24. Module in accordance with claim 16, wherein:
at least one pump of a pump device for the generation of a vacuum is arranged at the second support.

25. Module in accordance with claim 16, wherein:
the first support and/or the second support are formed as cars or carriages that can be laterally retracted from the chamber section or as cars or carriages that can be laterally traversed away from the chamber section.

26. Module in accordance with claim 16, wherein:
the module is formed such that the first and/or the second support can be guided by means for guiding the first and/or second support as it is retracted from the chamber section or traversed away from chamber section and/or as it is inserted into the chamber section or traversed up to the chamber section.

27. Module in accordance claim 16, wherein:
the first support is displaceable from the chamber section to such an extent that an area accessible to persons is created between the first support and the chamber section.

28. Module in accordance with claim 16, wherein:
the second support is displaceable from the first support to such an extent that an area accessible to persons is created between the first support and the second support.

29. Module in accordance with claim 16, wherein:
the chamber section features a vertical passage for transporting the substrate to be coated through the chamber section.

30. Module in accordance with claim 22, wherein:
there is an essentially vertical arrangement of the process tools at the first support.

31. Machine in accordance with claim 1, wherein:
the first support can be laterally displaced relative to the chamber section and the second support can be laterally displaced relative to the first support to provide a maintenance position.

32. Module in accordance with claim 16, wherein:
the first support can be laterally displaced relative to the chamber section and the second support can be laterally displaced relative to the first support to provide a maintenance position.

* * * * *